US010790297B2

(12) United States Patent
Chen et al.

(10) Patent No.: US 10,790,297 B2
(45) Date of Patent: Sep. 29, 2020

(54) METHOD FOR FORMING CHANNEL HOLE IN THREE-DIMENSIONAL MEMORY DEVICE USING NONCONFORMAL SACRIFICIAL LAYER

(71) Applicant: YANGTZE MEMORY TECHNOLOGIES CO., LTD., Wuhan (CN)

(72) Inventors: Baoyou Chen, Wuhan (CN); Weihua Cheng, Wuhan (CN); Hai Hui Huang, Wuhan (CN); Zhuqing Huang, Wuhan (CN); Guanping Wu, Wuhan (CN); Hongbin Zhu, Wuhan (CN); Yu Qi Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 63 days.

(21) Appl. No.: 16/195,855

(22) Filed: Nov. 20, 2018

(65) Prior Publication Data
US 2020/0119042 A1 Apr. 16, 2020

Related U.S. Application Data

(63) Continuation of application No. PCT/CN2018/109826, filed on Oct. 11, 2018.

(51) Int. Cl.
*H01L 27/11582* (2017.01)
*H01L 21/02* (2006.01)
(Continued)

(52) U.S. Cl.
CPC .... *H01L 27/11582* (2013.01); *H01L 21/0206* (2013.01); *H01L 21/31111* (2013.01); *H01L 27/11556* (2013.01)

(58) Field of Classification Search
None
See application file for complete search history.

(56) References Cited

U.S. PATENT DOCUMENTS 9,461,063 B1 10/2016 Lai et al.
9,842,851 B2 12/2017 Pachamuthu et al.
(Continued)

FOREIGN PATENT DOCUMENTS

CN 105374826 A 3/2016
CN 108206188 A 6/2018
(Continued)

OTHER PUBLICATIONS

International Search Report issued in corresponding International Application Na PCT/CN2018/109826, dated Jul. 15, 2019, 4 pages.
(Continued)

*Primary Examiner* — Shaun M Campbell
(74) *Attorney, Agent, or Firm* — Bayes PLLC

(57) ABSTRACT

Embodiments of methods for forming channel holes in 3D memory devices using a nonconformal sacrificial layer are disclosed. In an example, a dielectric stack including interleaved first dielectric layers and second dielectric layers is formed on a substrate. An opening extending vertically through the dielectric stack is formed. A nonconformal sacrificial layer is formed along a sidewall of the opening, such that a variation of a diameter of the opening decreases. The nonconformal sacrificial layer and part of the dielectric stack abutting the nonconformal sacrificial layer are removed. A channel structure is formed in the opening after removing the nonconformal sacrificial layer and part of the dielectric stack.

20 Claims, 8 Drawing Sheets

(51) Int. Cl.
*H01L 21/311* (2006.01)
*H01L 27/11556* (2017.01)

(56) References Cited

U.S. PATENT DOCUMENTS

| | | | |
|---|---|---|---|
| 2010/0003795 A1 | 1/2010 | Park et al. | |
| 2011/0260237 A1 | 10/2011 | Lee et al. | |
| 2012/0156848 A1* | 6/2012 | Yang | H01L 27/11529 |
| | | | 438/287 |
| 2013/0240143 A1* | 9/2013 | Kiyose | H01L 21/67057 |
| | | | 156/345.15 |
| 2013/0256775 A1 | 10/2013 | Shim et al. | |
| 2014/0367762 A1* | 12/2014 | Tian | H01L 27/11556 |
| | | | 257/321 |
| 2015/0263034 A1* | 9/2015 | Higuchi | H01L 27/1157 |
| | | | 257/324 |
| 2015/0371993 A1 | 12/2015 | Jung | |
| 2018/0182771 A1 | 6/2018 | Costa et al. | |

FOREIGN PATENT DOCUMENTS

| | | |
|---|---|---|
| CN | 108431961 A | 8/2018 |
| CN | 108807409 A | 11/2018 |

OTHER PUBLICATIONS

Written Opinion of the International Searching Authority issued in corresponding International Application No. PCT/CN2018/109826, dated Jul. 15, 2019, 5 pages.

\* cited by examiner

METHOD FOR FORMING CHANNEL HOLE IN THREE-DIMENSIONAL MEMORY DEVICE USING NONCONFORMAL SACRIFICIAL LAYER

CROSS REFERENCE TO RELATED APPLICATION

This application is continuation of International Application No. PCT/CN2018/109826, filed on Oct. 11, 2018, entitled "METHOD FOR FORMING CHANNEL HOLE IN THREE-DIMENSIONAL MEMORY DEVICE USING NONCONFORMAL SACRIFICIAL LAYER," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of methods for forming channel holes in 3D memory devices using a nonconformal sacrificial layer are disclosed herein.

In an example, a method for forming a 3D memory device is disclosed. A dielectric stack including interleaved first dielectric layers and second dielectric layers is formed on a substrate. An opening extending vertically through the dielectric stack is formed. A nonconformal sacrificial layer is formed along a sidewall of the opening, such that a variation of a diameter of the opening decreases. The nonconformal sacrificial layer and part of the dielectric stack abutting the nonconformal sacrificial layer are removed. A channel structure is formed in the opening after removing the nonconformal sacrificial layer and part of the dielectric stack.

In another example, a method for forming a channel hole in a 3D memory device is disclosed. An opening is etched through interleaved silicon oxide layers and silicon nitride layers on a substrate. A nonconformal sacrificial layer is deposited along a sidewall of the opening. A thickness of the nonconformal sacrificial layer decreases from top to bottom along the sidewall of the opening. A first etchant having a selectivity between silicon oxide and silicon nitride between about 0.9 and about 1.1 is applied through the opening to form the channel hole.

In still another example, a 3D memory device includes a substrate, a memory stack including interleaved conductor layers and dielectric layers on the substrate, and a memory string extending vertically through the memory stack. The memory string includes a channel structure. A variation of a diameter of the channel structure is not greater than about 25%.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
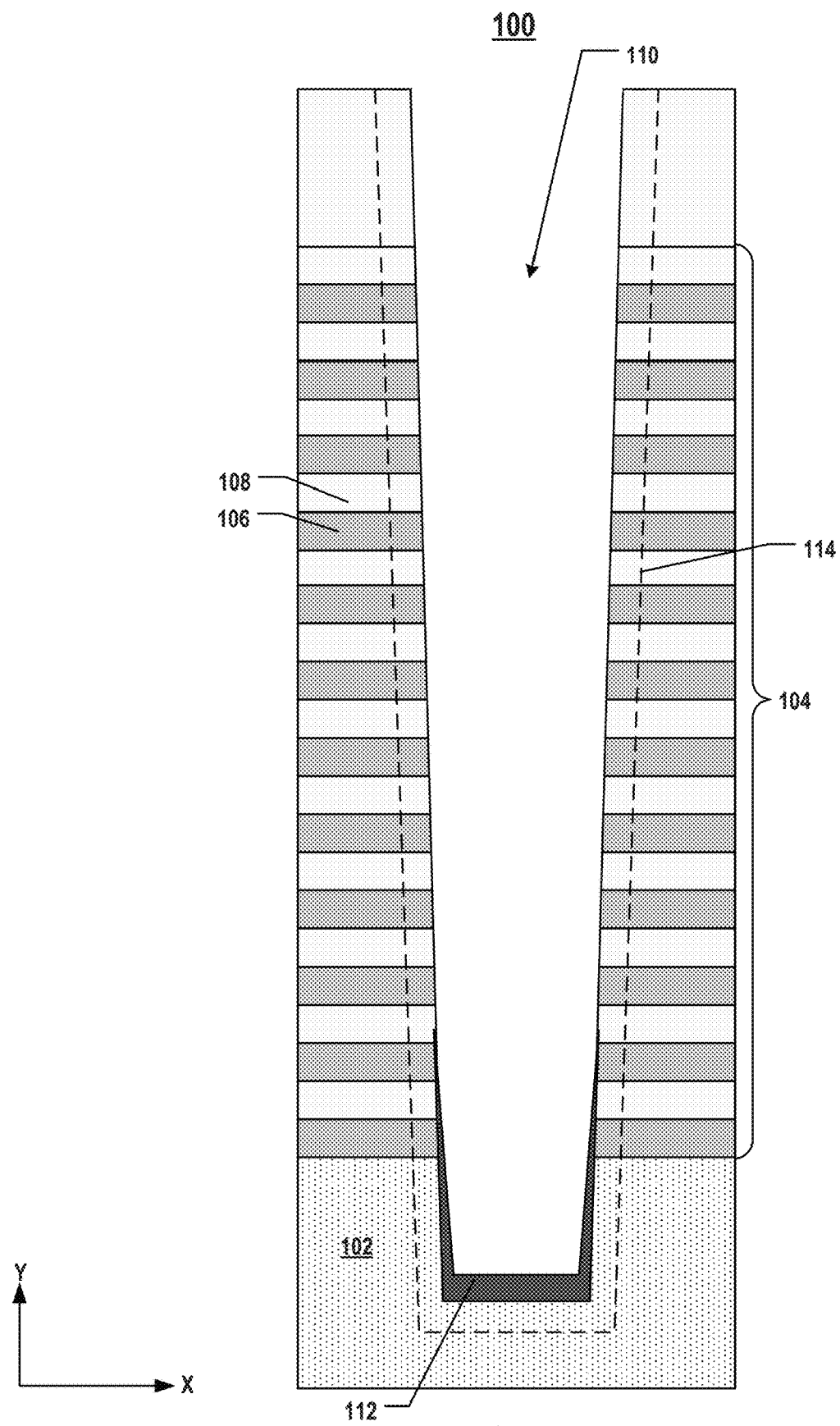
FIG. 1 illustrates a cross-section of an exemplary channel hole in a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug (e.g., silicon crystalline silicon plug) is typically formed at the lower end of the channel hole. Several wet etching processes are usually used to clean the channel hole after it is being etched, for example, by a dry etching process. Because most wet etching processes are isotropic etching, the critical dimension of the channel hole can be significantly enlarged by the cleaning, thereby causing various issues including strict requirement of critical dimension control in channel hole etching and tilted profile of the channel hole. The enlargement of the critical dimension in the top portion of the channel hole can significantly affect later gate replacement processes, for example, tungsten deposition in the lateral recesses. Moreover, the native oxide and wafer debris may not be completely cleaned up because aggressive wet etching process cannot be applied, which can affect the formation of the semiconductor plug.

For example, FIG. 1 illustrates a cross-section of an exemplary channel hole 110 in a 3D memory device 100 at a fabrication stage for forming channel hole 110 extending vertically through a dielectric stack 104. Dielectric stack 104 can include a plurality of pairs (referred to herein as "dielectric layer pairs") each including a first dielectric layer 106 and a second dielectric layer (also known as a "sacrificial layer") 108 formed above a substrate 102. Once all the fabrication processes are finished, dielectric stack 104 is replaced with a memory stack by a gate replacement process, which replaces each sacrificial layer 108 with a conductor layer. The number of dielectric layer pairs can determine the number of "levels" (also known as "tiers," e.g., 32, 64, 96, 128, etc.) of 3D memory device 100.

As shown in FIG. 1, an opening is etched through dielectric stack 104 and extends into part of substrate 102 to form channel hole 110, in which a NAND memory string can be formed. Channel hole 110 is usually etched for dry etching processes, such as deep reactive ion etching (DRIE). As the levels of 3D memory device 100 continue to increase for higher cell density, the aspect ratio of channel hole 110 increases as well, which makes it even more difficult to obtain a vertical sidewall profile of channel hole 110 with uniform diameters at different depths. As a result, the diameter of channel hole 110 increases from bottom to top as shown in FIG. 1.

Some post-etch residuals (not shown) may remain in channel hole 110 before or even after the cleaning processes, such as wafer debris and polymers from a dry etching process. Native oxide 112 may be also formed in the lower portion of channel hole 110, e.g., on the sidewall and bottom surface where substrate 102 is exposed to the air. In order to remove the post-etch residuals and native oxide 112, one or more cleaning processes, such as post-etch treatment and semiconductor plug growth pre-clean, are performed between the fabrication stages of channel hole etching and semiconductor plug growth. The isotropic etching used by the cleaning processes can enlarge the dimension of channel hole 110 in all directions as shown by post-clean profile 114 of channel hole 110. The tilted sidewall of post-clean profile 114 makes the diameter of channel hole 110 in the top portion even larger, which is undesirable for later gate replacement processes. The variation of the diameter of channel hole 110 (determined based on the largest and smallest diameters of channel hole 110) can be 25% or more before and/or after the cleaning processes.

Various embodiments in accordance with the present disclosure provide an effective method for forming channel holes with less-tilted profile using a nonconformal sacrificial layer. The less-tilted sidewall profile can reduce the difficulty in controlling the channel hole critical dimension, in particular, for channel holes with high aspect ratios in advanced 3D memory devices. The better control of the channel hole critical dimension can greatly improve the process margin in later processes, such as channel structure deposition and gate replacement, thereby increasing the product reliability and yield. Moreover, more aggressive cleaning processes can be used in the method disclosed herein to effectively remove the native oxide and post-etch residuals in the channel holes, which can create better conditions for growing semiconductor plug.

Figure 2:
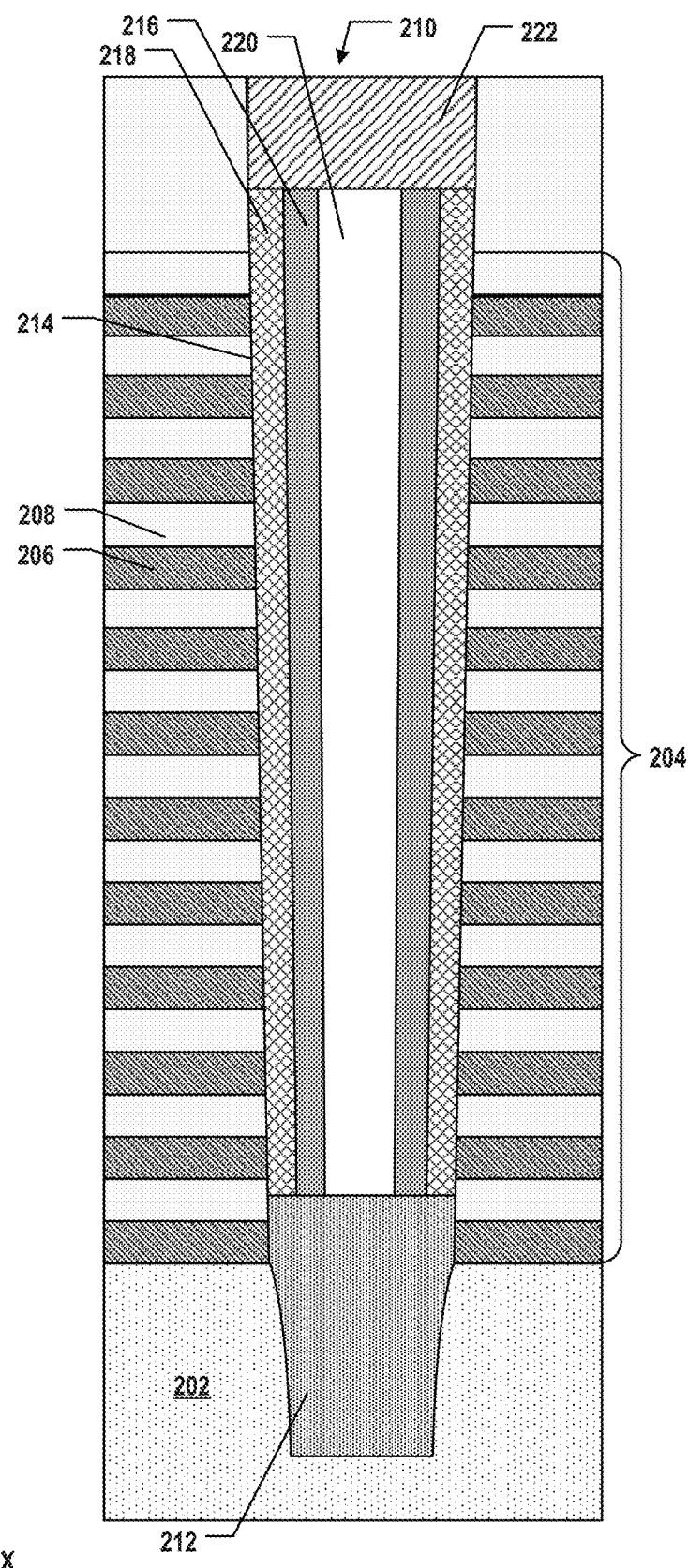
FIG. 2 illustrates a cross-section of an exemplary 3D memory device, according to some embodiments of the present disclosure.

FIG. 2 illustrates a cross-section of an exemplary 3D memory device 200, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof. It is noted that x and y axes are included in FIG. 2 to further illustrate the spatial relationship of the components in 3D memory device 200. Substrate 202 of 3D memory device 200 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 200) is determined relative to the substrate of the 3D memory device (e.g., substrate 202) in the y-direction (i.e., the vertical direction) when the substrate is positioned in the lowest plane of the 3D memory device in the y-direction. The same notion for describing spatial relationship is applied throughout the present disclosure.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of an array of NAND memory strings 210 each extending vertically above substrate 202. The memory array device can include NAND memory strings 210 that extend through a plurality of pairs each including a conductor layer 206 and a dielectric layer 208 (referred to herein as "conductor/dielectric layer pairs"). The stacked conductor/dielectric layer pairs are also referred to herein as a "memory stack" 204. In some embodiments, an insulation layer (not shown) is formed between substrate 202 and memory stack 204. The number of the conductor/dielectric layer pairs in memory stack 204 (e.g., 32, 64, 96, or 128) determines the number of memory cells in 3D memory device 200. Memory stack 204 can include interleaved conductor layers 206 and dielectric layers 208. Conductor layers 206 and dielectric layers 208 in memory stack 204 can alternate in the vertical direction. Conductor layers 206 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof.

As shown in FIG. 2, NAND memory string 210 can include a channel structure 214 extending vertically through memory stack 204. Channel structure 214 can include a channel hole filled with semiconductor materials (e.g., as a semiconductor channel 216) and dielectric materials (e.g., as a memory film 218). In some embodiments, semiconductor channel 216 includes silicon, such as amorphous silicon, polysilicon, or single crystalline silicon. In some embodiments, memory film 218 is a composite layer including a tunneling layer, a storage layer (also known as a "charge trap layer"), and a blocking layer. The remaining space of channel structure 214 can be partially or fully filled with a filling layer 220 including dielectric materials, such as silicon oxide. Channel structure 214 can have a cylinder shape (e.g., a pillar shape). Filling layer 220, semiconductor channel 216, the tunneling layer, the storage layer, and the blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 218 can include a composite layer of silicon oxide/silicon oxynitride (or silicon nitride)/silicon oxide (ONO).

In some embodiments, conductor layer 206 (each being part of a word line) in memory stack 204 functions as a gate conductor of memory cells in NAND memory string 210. Conductor layer 206 can include multiple control gates of multiple NAND memory cells and can extend laterally as a word line ending at the edge of memory stack 204 (e.g., in a staircase structure of memory stack 204). In some embodiments, memory cell transistors in NAND memory string 210 include gate conductors (i.e., parts of conductor layers 206 that abut channel structure 214) made from tungsten, adhesion layers (not shown) including titanium/titanium nitride (Ti/TiN) or tantalum/tantalum nitride (Ta/TaN), gate dielectric layers (not shown) made from high-k dielectric materials, and channel structure 214 including polysilicon.

In some embodiments, NAND memory string 210 further includes a semiconductor plug 212 in a lower portion (e.g., at the lower end) of NAND memory string 210 below channel structure 214. As used herein, the "upper end" of a component (e.g., NAND memory string 210) is the end farther away from substrate 202 in the y-direction, and the "lower end" of the component (e.g., NAND memory string 210) is the end closer to substrate 202 in the y-direction when substrate 202 is positioned in the lowest plane of 3D memory device 200. Semiconductor plug 212 can include a semiconductor material, such as silicon, which is epitaxially grown from substrate 202 in any suitable directions. It is understood that in some embodiments, semiconductor plug 212 includes single crystalline silicon, the same material of substrate 202. In other words, semiconductor plug 212 can include an epitaxially-grown semiconductor layer that is the same as the material of substrate 202. In some embodiments, part of semiconductor plug 212 is above the top surface of substrate 202 and in contact with semiconductor channel 216. Semiconductor plug 212 can function as a channel controlled by a source select gate of NAND memory string 210. It is understood that in some embodiments, 3D memory device 200 does not include semiconductor plug 212.

In some embodiments, NAND memory string 210 further includes a channel plug 222 in an upper portion (e.g., at the upper end) of NAND memory string 210. Channel plug 222 can be in contact with the upper end of semiconductor channel 216. Channel plug 222 can include semiconductor materials (e.g., polysilicon) or conductive materials (e.g., metals). In some embodiments, channel plug 222 includes an opening filled with Ti/TiN or Ta/TaN as an adhesion layer and tungsten as a conductor. By covering the upper end of channel structure 214 during the fabrication of 3D memory device 200, channel plug 222 can function as an etch stop layer to prevent etching of dielectrics filled in channel structure 214, such as silicon oxide and silicon nitride. In some embodiments, channel plug 222 also functions as the drain of NAND memory string 210. It is understood that in some embodiments, 3D memory device 200 does not include channel plug 222.

Compared with post-clean profile 114 of channel hole 110 in FIG. 1, the sidewall profile of the channel hole (filled with channel structure 214, channel plug 222, and part of semiconductor plug 212) in 3D memory device 200 in FIG. 2 is less tilted (more vertical) because of the improved fabrication process as described below in detail. Specifically, a nonconformal sacrificial layer (removed in 3D memory device 200 in FIG. 2) can be formed prior to the cleaning process, followed by an aggressive etching process with a controlled selectivity to remove the nonconformal sacrificial layer and part of the dielectric stack, resulting in a less-tilted (more vertical) sidewall profile of the channel hole after cleaning. In some embodiments, the degrees of channel hole diameter enlargement caused by the cleaning process is less in the upper portion than the lower portion, thereby resulting in a less-tilted (more vertical) sidewall profile of the channel hole right before the formation of semiconductor plug 212 and channel structure 214.

In some embodiments, a variation of the diameter of channel structure 214 (and the channel hole thereof) is not greater than about 25%, such as not greater than 25%. In some embodiments, the variation of the diameter is between about 5% and about 25%, such as between 5% and 25% (e.g., 5%, 10%, 15%, 20%, 25%, any range bounded by the lower end by any of these values, or any range defined by any two of these values). In some embodiments, the variation of the diameter is between about 15% and about 25%, such as between 15% and 25% (e.g., 15%, 16%, 17%, 18%, 19%, 20%, 21%, 22%, 23%, 24%, 25%, any range bounded by the lower end by any of these values, or any range defined by any two of these values). The variation can be determined based on the largest and smallest diameters, for example, the difference between the largest and smallest diameters divided by the largest diameter. The variation of the channel hole diameter can be reduced by a nonconformal sacrificial layer deposition process and a subsequent aggressive etching process as described below in detail. In some embodiments, the diameter of channel structure 214 is greater than the diameter of semiconductor plug 212 due to the aggressive etching process that enlarges the channel hole when removing the nonconformal sacrificial layer and part of the dielectric stack.

Channel structure 214 with less-tilted (more vertical) sidewall profile as illustrated in FIG. 2, e.g., the variation of diameter being not greater than 25%, can allow larger spacings between adjacent channel holes in 3D memory device 200, which can relax the later fabrication processes, such as deposition of tungsten in lateral recesses during the gate replacement process. The reduced variation of the channel hole diameter can also increase the cleaning margin to allow a more aggressive and thorough cleaning process to remove the post-etch residuals and native oxide in the bottom of the channel hole, which can improve the growth conditions of semiconductor plug 212.

Figure 3A:
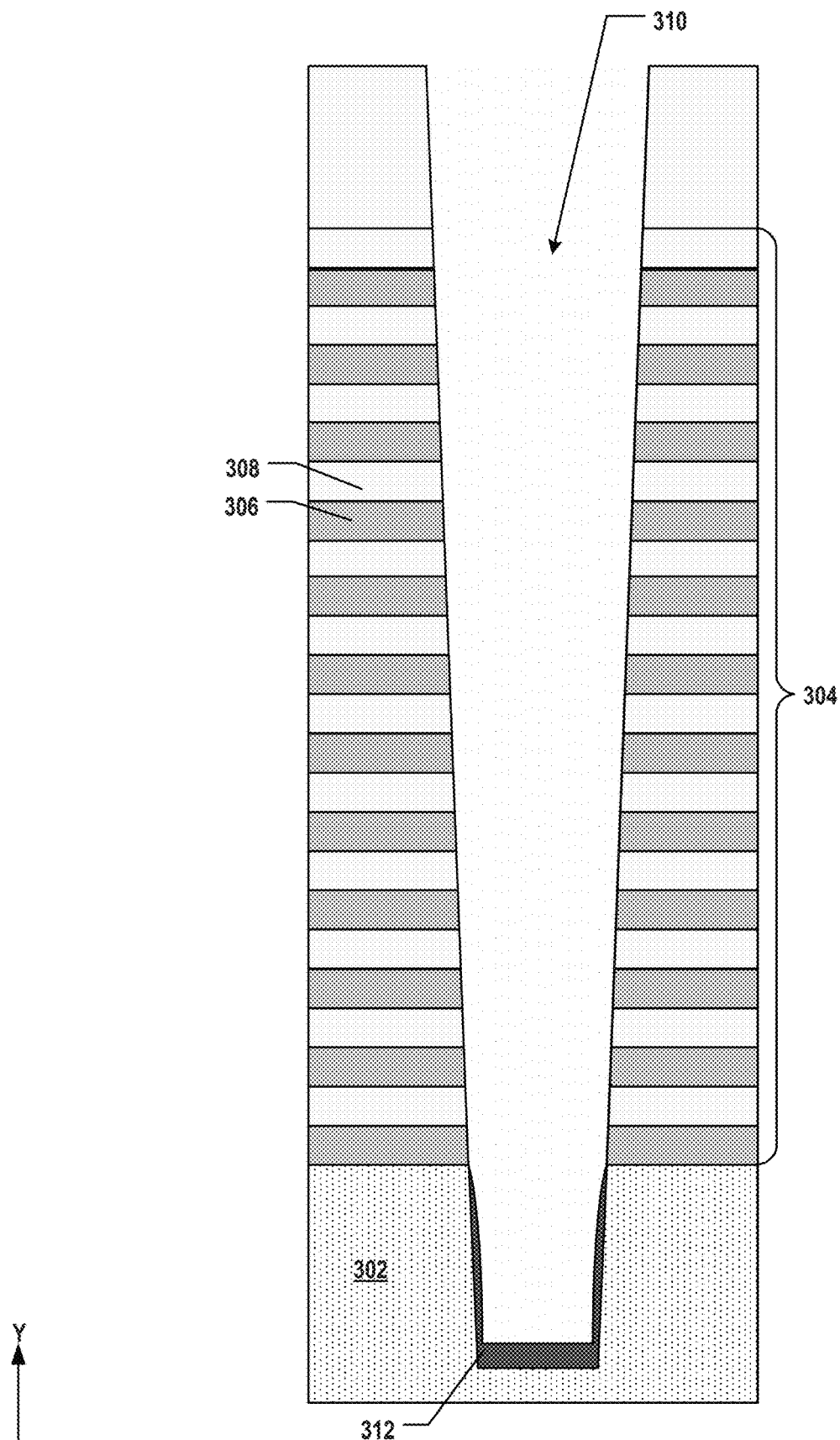
FIGS. 3A-3D illustrate an exemplary fabrication process for forming a 3D memory device, according to some embodiments of the present disclosure.
Figure 4:
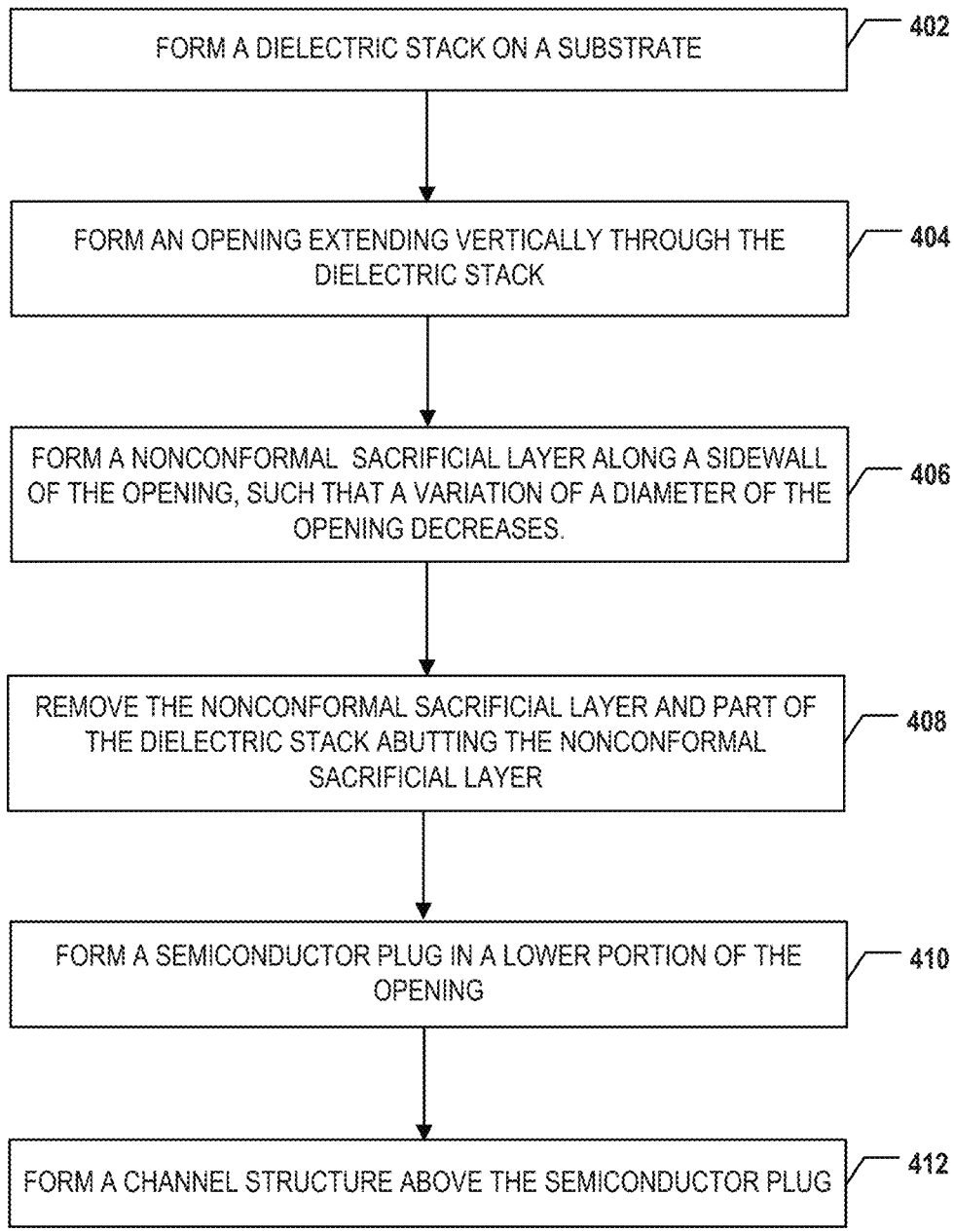
FIG. 4 illustrates a flowchart of an exemplary method for forming a 3D memory device, according to some embodiments of the present disclosure.
Figure 5:
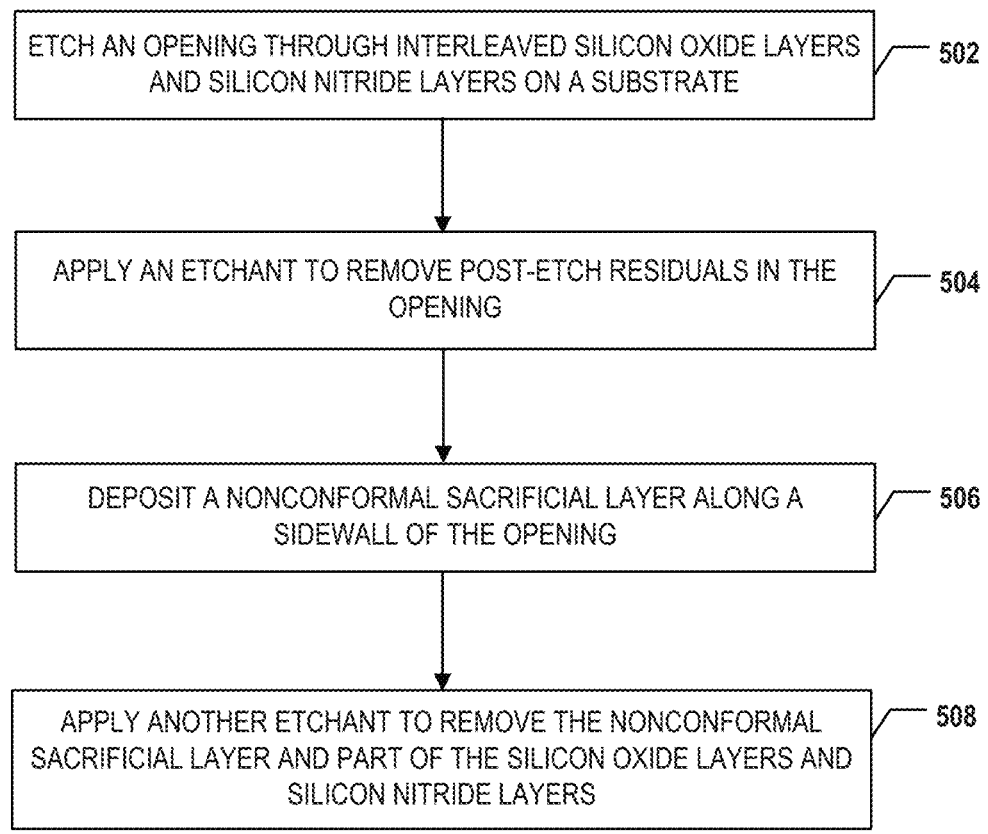
FIG. 5 illustrates a flowchart of an exemplary method for forming a channel hole in a 3D memory device, according to some embodiments of the present disclosure.

FIGS. 3A-3D illustrate an exemplary fabrication process for forming a 3D memory device, according to some embodiments of the present disclosure. FIG. 4 illustrates a flowchart of an exemplary method 400 for forming a 3D memory device, according to some embodiments of the present disclosure. FIG. 5 illustrates a flowchart of an exemplary method 500 for forming a channel hole in a 3D memory device, according to some embodiments of the present disclosure. Examples of the 3D memory device depicted in FIGS. 3A-3D, 4, and 5 include 3D memory device 200 depicted in FIG. 2. FIGS. 3A-3D, 4, and 5 will be described together. It is understood that the operations shown in methods 400 and 500 are not exhaustive and that other operations can be performed as well before, after, or between any of the illustrated operations. Further, some of the operations may be performed simultaneously, or in a different order than shown in FIGS. 4 and 5.

Referring to FIG. 4, method 400 starts at operation 402, in which a dielectric stack is formed on a substrate. The substrate can be a silicon substrate. The dielectric stack can include interleaved first dielectric layers and second dielectric layers. Referring to FIG. 3A, a dielectric stack 304 including a plurality pairs of a first dielectric layer 306 and a second dielectric layer (known as a "sacrificial layer") 308 (together referred to herein as "dielectric layer pairs") is formed on a silicon substrate 302. That is, dielectric stack 304 includes interleaved sacrificial layers 308 and dielectric layers 306, according to some embodiments. Dielectric layers 306 and sacrificial layers 308 can be alternatively deposited on silicon substrate 302 to form dielectric stack 304. In some embodiments, each dielectric layer 306 includes a layer of silicon oxide, and each sacrificial layer 308 includes a layer of silicon nitride. Dielectric stack 304 can be formed by one or more thin film deposition processes including, but not limited to, chemical vapor deposition (CVD), physical vapor deposition (PVD), atomic layer deposition (ALD), or any combination thereof. In some embodiments, an insulation layer (not shown) is formed between silicon substrate 302 and dielectric stack 304 by depositing dielectric materials, such as silicon oxide, on silicon substrate 302.

Method 400 proceeds to operation 404, as illustrated in FIG. 4, in which an opening extending vertically through the dielectric stack is formed. In the example shown in FIG. 5, at operation 502, an opening is etched through interleaved silicon oxide layers and silicon nitride layers on a substrate. As illustrated in FIG. 3A, a channel hole 310 is formed by etching an opening extending vertically through dielectric stack 304. In some embodiments, a plurality of openings are formed through dielectric stack 304 such that each opening becomes the location for growing an individual NAND memory string in the later process. In some embodiments, fabrication processes for forming channel hole 310 include wet etching and/or dry etching, such as DRIE. In some embodiments, channel hole 310 extends further into the top portion of silicon substrate 302. The etching process through dielectric stack 304 may not stop at the top surface of silicon substrate 302 and may continue to etch part of silicon substrate 302. In some embodiments, a separate etching process is used to etch part of silicon substrate 302 after etching through dielectric stack 304. After etching, native oxide 312 may be formed in the lower portion of channel hole 310, for example, on the sidewall and bottom surface where silicon substrate 302 is exposed in the air. Post-etch residuals (not shown) from the drying etching process in forming channel hole 310, such as wafer debris and polymers, may remain in channel hole 310, for example, on the sidewall and/or bottom surface of channel hole 310.

In the example shown in FIG. 5, at operation 504, an etchant is applied through the opening to remove post-etch residuals in the opening. As illustrated in FIG. 3A, at least some of the post-etch residuals are removed by wet etching, such as applying an etchant through channel hole 310. The etchant can be heated up to increase the etching rate. In some embodiments, the etchant for removing the post-etch residuals, such as polymers, includes a mixture of sulfuric acid and hydrogen peroxide (SPM).

Method 400 proceeds to operation 406, as illustrated in FIG. 4, in which a nonconformal sacrificial layer is formed along a sidewall of the opening, such that a variation of a diameter of the opening decreases. In the example shown in FIG. 5, at operation 506, a nonconformal sacrificial layer is deposited along the sidewall of the opening. The thickness of the nonconformal sacrificial layer can decrease from top to bottom along the sidewall of the opening. The nonconformal sacrificial layer can include silicon oxide or any other suitable sacrificial materials, such as silicon nitride and polysilicon. In some embodiments, after forming the nonconformal sacrificial layer, a variation of a diameter of the opening is not greater than about 25%.

Figure 3B:
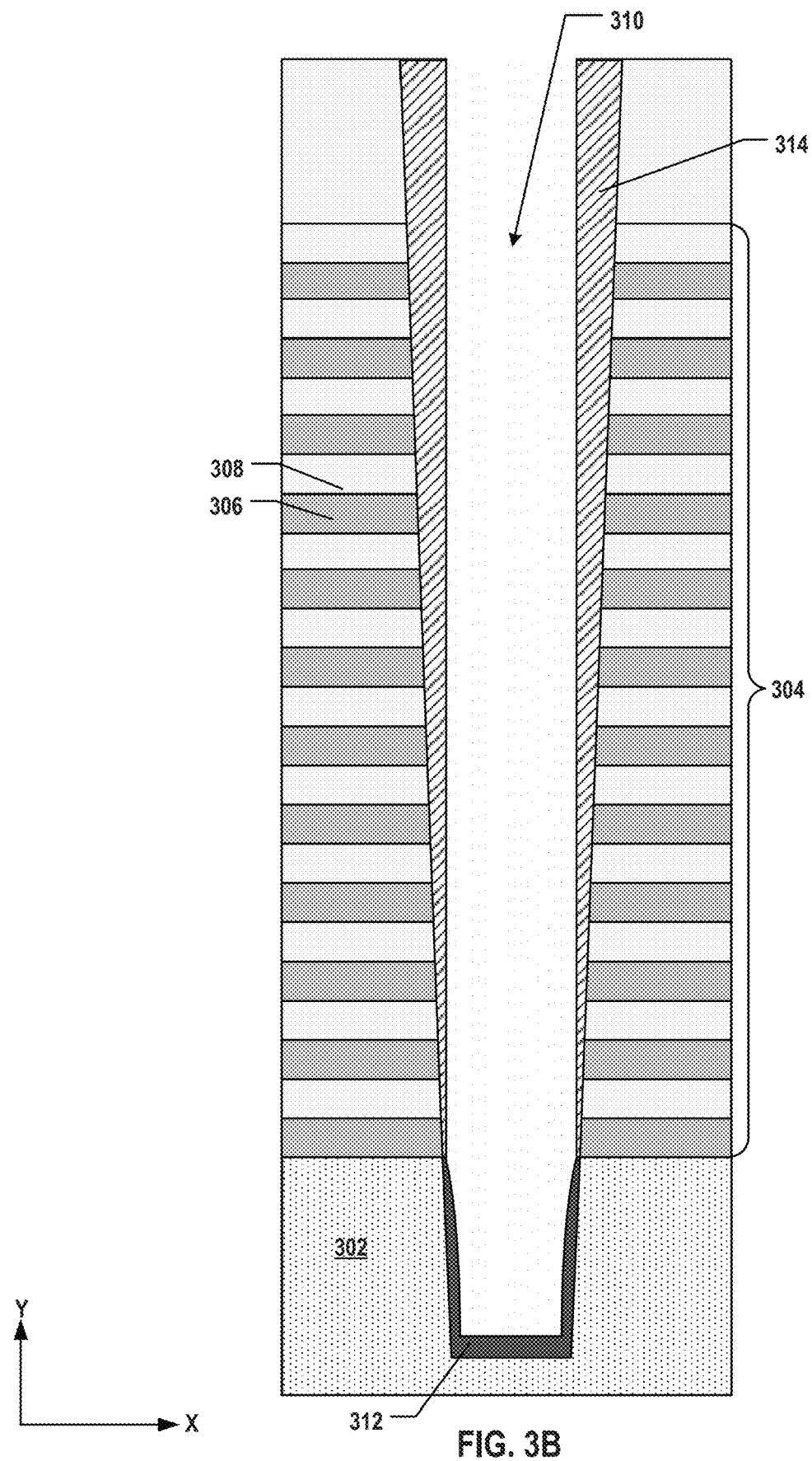

As illustrated in FIG. 3B, a nonconformal sacrificial layer 314 is formed along the sidewall of channel hole 310. The thickness of nonconformal sacrificial layer 314 decreases from top to bottom along the sidewall of channel hole 310, according to some embodiments. In some embodiments, the thickness of nonconformal sacrificial layer 314 gradually decreases from the upper end of channel hole 310 to the lower end of channel hole 310, for example, at its bottom surface. The thickness of nonconformal sacrificial layer 314 can reduce to about 0 (i.e., not being deposited) at the lower end of channel hole 310 or anywhere above the lower end, for example, at the interface between silicon substrate 302 and dielectric stack 304. That is, nonconformal sacrificial layer 314 may not cover the entire sidewall of channel hole 310 as its thickness decreases from top to bottom along the sidewall of channel hole 310. In some embodiments, nonconformal sacrificial layer 314 can be a nonconformal composite layer including multiple sub-layers, at least one of which is a nonconformal layer. One or more of the sub-layers can be conformal layers, but the sub-layers together are nonconformal along the sidewall of channel hole 310.

Nonconformal sacrificial layer 314 can include dielectric materials, such as silicon oxide and silicon nitride, semiconductor materials, such as polysilicon, or any combination thereof. Nonconformal sacrificial layer 314 can include any other sacrificial materials that can be deposited along the tilted sidewall of channel hole 310 by nonconformal depositions and later removed. In one example, nonconformal sacrificial layer 314 includes silicon oxide. Nonconformal depositions are depositions where a layer is deposited in an uneven manner, thereby resulting in a variation in thickness of the layer. Nonconformal sacrificial layer 314 can be formed by any nonconformal depositions including, but not limited to, PVD depositions, such as evaporation, ion plating, and sputtering.

By depositing nonconformal sacrificial layer 314, the variation of the diameter of channel hole 310 in the vertical direction can be reduced (e.g., comparing FIGS. 3A and 3B). In some embodiments, after depositing nonconformal sacrificial layer 314, the variation of the diameter of channel hole 310 becomes not greater than about 25%. In other words, nonconformal sacrificial layer 314 can compensate for the relatively large variation of the diameter of channel hole 310 after dry etching as shown in FIG. 3A and can make the sidewall profile less tilted (more vertical). In some embodiments, the variation of the diameter of channel hole 310 after depositing nonconformal sacrificial layer 314 is between about 5% and about 25%, such as between 5% and 25% (e.g., 5%, 10%, 15%, 20%, 25%, any range bounded by the lower end by any of these values, or any range defined by any two of these values). In some embodiments, the variation of the diameter is between about 15% and about 25%, such as between 15% and 25% (e.g., 15%, 16%, 17%, 18%, 19%, 20%, 21%, 22%, 23%, 24%, 25%, any range bounded by the lower end by any of these values, or any range defined by any two of these values).

Method 400 proceeds to operation 408, as illustrated in FIG. 4, in which the nonconformal sacrificial layer and part of the dielectric stack abutting the nonconformal sacrificial layer are removed. In the example shown in FIG. 5, at operation 508, another etchant is applied through the opening to remove the nonconformal sacrificial layer and part of the silicon oxide layers and the silicon nitride layers in the dielectric stack. In some embodiments, the nonconformal sacrificial layer and part of the dielectric stack are wet etched by applying an etchant through the opening, which has a selectivity between the first dielectric layer (e.g., silicon oxide) and the second dielectric layer (e.g., silicon nitride) between about 0.9 and about 1.1. The selectivity of the etchant can be about 1. In some embodiments in which the first and second dielectric layers include silicon oxide and silicon nitride, respectively, the etchant includes a mixture of hydrofluoric acid and sulfuric acid. In some embodiments, after removing the nonconformal sacrificial layer and part of the dielectric stack, the diameter of the opening has a variation not greater than about 25%.

Figure 3C:
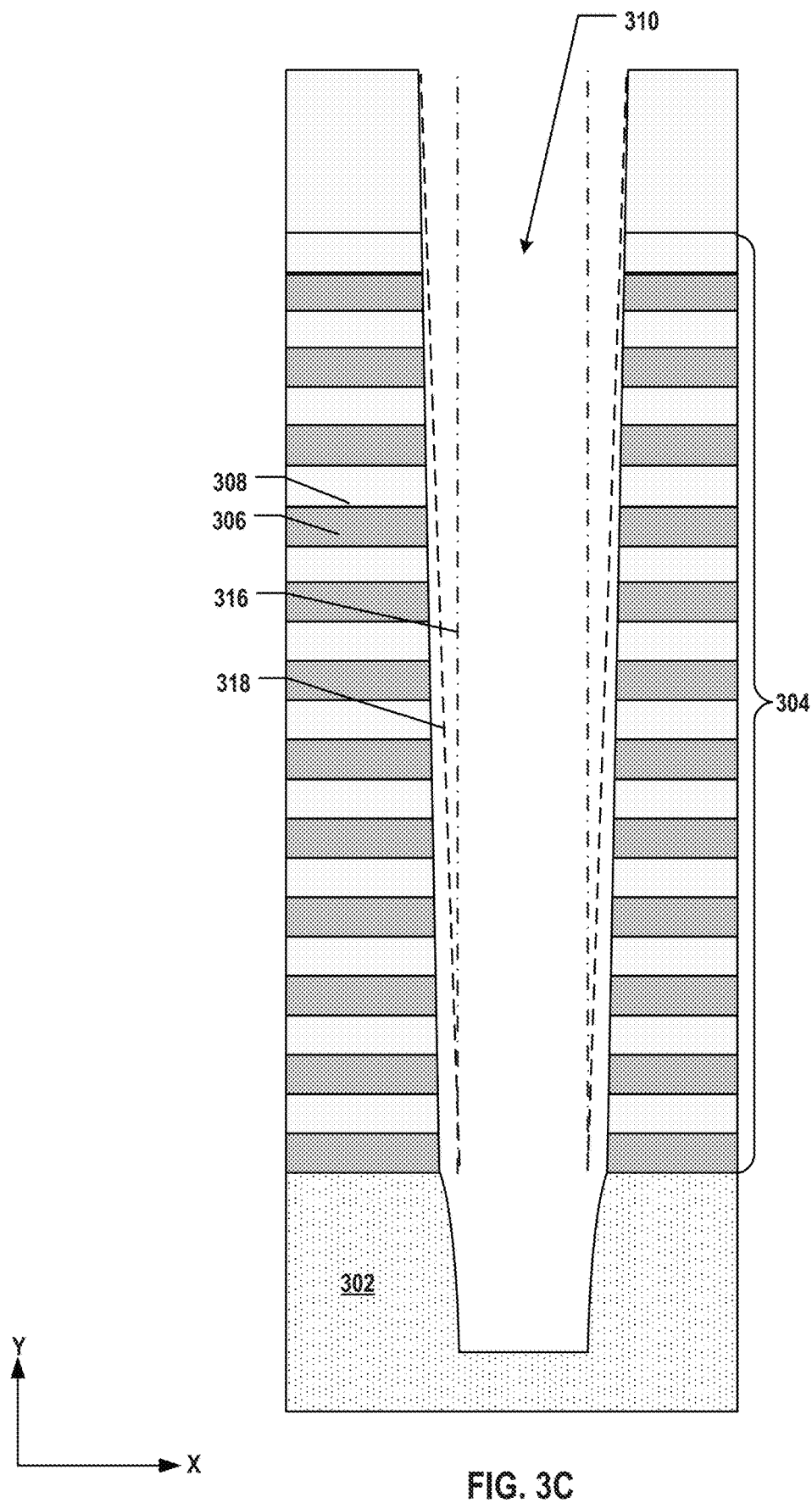

As illustrated in FIG. 3C, nonconformal sacrificial layer 314 (shown in FIG. 3B) is removed by an etching process, and part of dielectric stack 304 abutting nonconformal sacrificial layer 314 is removed by the same etching process as well to maintain substantially the same sidewall slope before and after the etching process. Sidewall profile 316 of nonconformal sacrificial layer 314 prior to the etching process and interface profile 318 between nonconformal sacrificial layer 314 and the edge of dielectric stack 304 are shown in FIG. 3C to illustrate the structures removed by the etching process, which include entire nonconformal sacrificial layer 314 and part of dielectric stack 304 abutting nonconformal sacrificial layer 314. In some embodiments, an etchant is used for isotropic wet etching of nonconformal sacrificial layer 314, dielectric layers 306, and sacrificial layers 308 at substantially the same etch rate such that the amounts of materials etched away by the etchant are substantially the same along the sidewall of channel hole 310 (e.g., in the y-direction). As a result, the variation of channel hole diameter can remain substantially the same after removing nonconformal sacrificial layer 314. In some embodiments, after removing nonconformal sacrificial layer 314 (between sidewall profile 316 and interface profile 318) and part of dielectric stack 304 (between interface profile 318 and the sidewall of dielectric stack 304), the variation of the diameter of channel hole 310 is not greater than about 25%. In some embodiments, the variation of the diameter after removing nonconformal sacrificial layer 314 is between about 5% and about 25%, such as between 5% and 25% (e.g., 5%, 10%, 15%, 20%, 25%, any range bounded by the lower end by any of these values, or any range defined by any two of these values). In some embodiments, the variation of the diameter is between about 15% and about 25%, such as between 15% and 25% (e.g., 15%, 16%, 17%, 18%, 19%, 20%, 21%, 22%, 23%, 24%, 25%, any range bounded by the lower end by any of these values, or any range defined by any two of these values).

The "aggressive" wet etching for removing nonconformal sacrificial layer 314 can be achieved by applying an etchant having a selectivity between dielectric layer 306 (e.g., silicon oxide) and sacrificial layer 308 (e.g., silicon nitride) between about 0.9 and about 1.1, such as between 0.9 and 1.1 (e.g., 0.9, 0.95, 1, 1.05, 1.1, any range bounded by the lower end by any of these values, or any range defined by any two of these values). In some embodiments, the selectivity of the etchant is about 1, such as 1. In some embodiments, nonconformal sacrificial layer 314 is a silicon oxide layer or a silicon nitride layer, dielectric layer 306 is a silicon oxide layer, and sacrificial layer 308 is a silicon nitride layer, and the selectivity of the etchant between silicon oxide and silicon nitride is nominally the same. In some embodiments, the etchant includes a mixture of hydrofluoric acid and sulfuric acid. The concentrations of hydrofluoric acid and sulfuric acid can be adjusted such that the selectivity of the mixture between silicon oxide and silicon nitride is nominally the same. It is understood that the constituents and/or concentrations of the etchant can vary depending on the materials used by nonconformal sacrificial layer 314, dielectric layer 306, and sacrificial layer 308.

As illustrated in FIG. 3C, native oxide 312 (shown in FIG. 3B) is removed by the etchant as well. Compared with the example in FIG. 1, native oxide 312 can be more effectively removed from channel hole 310 by applying the aggressive wet etching process described above, which more evenly enlarges the diameter of channel hole 310 in different depths. The diameter of channel hole 310 below the top surface of silicon substrate 302 (i.e., the part extending into silicon substrate 302) is not increased, according to some embodiments, as the etchant may have a high selectivity to silicon. As a result, the diameter of channel hole 310 above the top surface of silicon substrate 302 may be greater than the diameter therebelow. In some embodiments, one or more additional cleaning processes, such as post-etch treatment and semiconductor plug growth pre-clean processes, to further remove any remaining post-etch residuals prior to and after the removal of nonconformal sacrificial layer 314.

Figure 3D:
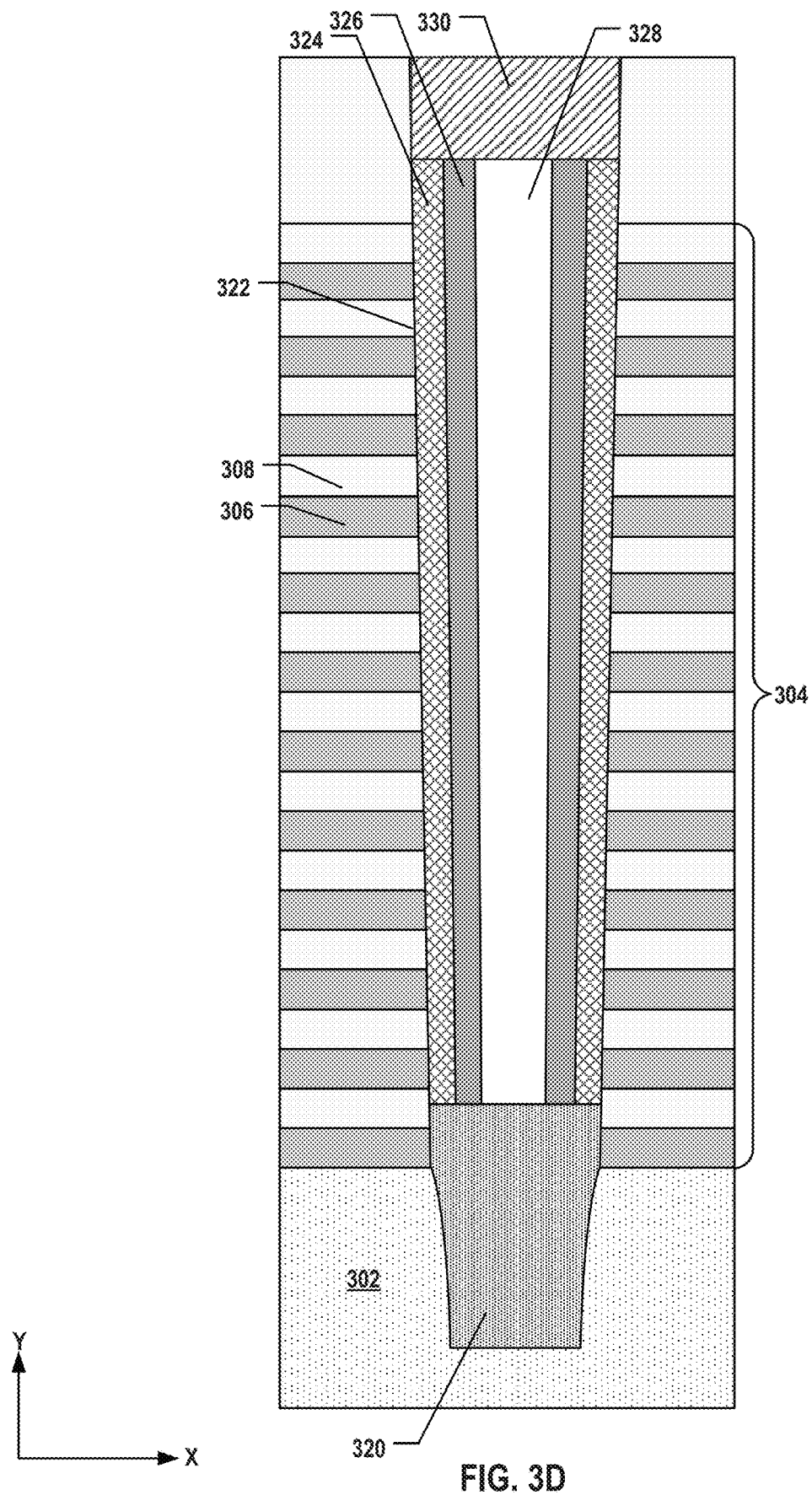

Method 400 proceeds to operation 410, as illustrated in FIG. 4, in which a semiconductor plug is formed in the lower portion of the opening. The semiconductor plug can be epitaxially grown from the substrate in the lower portion of the opening. In some embodiments, the semiconductor plug is an epitaxially-grown silicon plug. As illustrated in FIG. 3D, a silicon plug 320 can be formed by filling the lower portion of channel hole 310 with single crystalline silicon epitaxially grown from silicon substrate 302 in any suitable directions (e.g., from bottom surface and/or side surface). The fabrication processes for epitaxially growing silicon plug 320 can include, but not limited to, vapor-phase epitaxy (VPE), liquid-phase epitaxy (LPE), molecular-beam epitaxy (MPE), or any combinations thereof. It is understood that in some embodiments, operation 410 can be skipped as the resulting 3D memory device may not include semiconductor plug 320.

Method 400 proceeds to operation 412, as illustrated in FIG. 4, in which a channel structure is formed above the semiconductor plug. In some embodiments, the channel structure includes a memory film and a semiconductor channel. As illustrated in FIG. 3D, a channel structure 322 is formed above silicon plug 320 in channel hole 310 (shown in FIG. 3C). Channel structure 322 can include a memory film 324 (e.g., including a blocking layer, a storage layer, and a tunneling layer) and a semiconductor channel 326 formed above silicon plug 320. In some embodiments, memory film 324 is first deposited along the sidewall and bottom surface of channel hole 310, and semiconductor channel 326 is then deposited over memory film 324 and contact silicon plug 320. The blocking layer, storage layer, and tunneling layer can be subsequently deposited in this order using one or more thin film deposition processes, such as ALD, CVD, PVD, any other suitable processes, or any combination thereof, to form memory film 324. Semiconductor channel 326 can then be deposited on the tunneling layer using one or more thin film deposition processes, such as ALD, CVD, PVD, any other suitable processes, or any combination thereof. In some embodiments, a filling layer 328 is filled in the remaining space of channel hole 310 after the deposition of semiconductor channel 326 by depositing dielectric materials, such as silicon oxide.

As illustrated in FIG. 3D, a channel plug 330 is formed in the upper portion of channel hole 310. In some embodiments, parts of memory film 324, semiconductor channel 326, and filling layer 328 on the top surface of dielectric stack 304 and in the top portion of channel hole 310 can be removed by CMP, grinding, wet etching, and/or dry etching to form a recess in the upper portion of channel hole 310. Channel plug 330 then can be formed by depositing conductive materials, such as metals, into the recess by one or more thin film deposition processes, such as CVD, PVD, ALD, electroplating, electroless plating, or any combination thereof. A NAND memory sting is thereby formed.

Although not illustrated, it is understood that after the formation of the NAND memory string as shown in FIGS. 3A-3D, a memory stack can be formed by replacing sacrificial layers 308 in dielectric stack 304 with conductor layers. The memory stack thus can include a plurality of conductor/dielectric layer pairs. In some embodiments, to form the memory stack, a slit opening (e.g., a gate line slit) can be formed through dielectric stack 304, sacrificial layers 308 in dielectric stack 304 can be etched by applying etchants through the slit opening to form a plurality of lateral recesses, and the conductor layers can be deposited in the lateral recesses.

According to one aspect of the present disclosure, a method for forming a 3D memory device is disclosed. A dielectric stack including interleaved first dielectric layers and second dielectric layers is formed on a substrate. An opening extending vertically through the dielectric stack is formed. A nonconformal sacrificial layer is formed along a sidewall of the opening. The nonconformal sacrificial layer and part of the dielectric stack abutting the nonconformal sacrificial layer are removed. A semiconductor plug is formed in a lower portion of the opening after removing the nonconformal sacrificial layer and part of the dielectric stack. A channel structure is formed in the opening after removing the nonconformal sacrificial layer and part of the dielectric stack.

In some embodiments, a thickness of the nonconformal sacrificial layer decreases from top to bottom along the sidewall of the opening.

In some embodiments, to remove the nonconformal sacrificial layer and part of the dielectric stack, a first etchant having a selectivity between the first dielectric layer and the second dielectric layer between about 0.9 and about 1.1 is applied through the opening. The selectivity of the first etchant can be about 1. In some embodiments, the first and second dielectric layers include silicon oxide and silicon nitride, respectively, and the first etchant includes a mixture of hydrofluoric acid and sulfuric acid.

In some embodiments, the nonconformal sacrificial layer includes silicon oxide.

In some embodiments, prior to forming the nonconformal sacrificial layer, a second etchant is applied through the opening to remove post-etch residuals in the opening. The second etchant can include a mixture of sulfuric acid and hydrogen peroxide.

In some embodiments, after forming the nonconformal sacrificial layer, the variation of the diameter of the opening is not greater than about 25%. In some embodiments, after removing the nonconformal sacrificial layer and part of the dielectric stack, the variation of the diameter of the opening is not greater than about 25%.

In some embodiments, a semiconductor plug is formed in a lower portion of the opening after removing the nonconformal sacrificial layer and part of the dielectric stack.

According to another aspect of the present disclosure, a method for forming a channel hole in a 3D memory device is disclosed. An opening is etched through interleaved silicon oxide layers and silicon nitride layers on a substrate. A nonconformal sacrificial layer is deposited along a sidewall of the opening. A thickness of the nonconformal sacrificial layer decreases from top to bottom along the sidewall of the opening. A first etchant having a selectivity between silicon oxide and silicon nitride between about 0.9 and about 1.1 is applied through the opening to form the channel hole.

In some embodiments, the selectivity of the first etchant is about 1. In some embodiments, the first etchant includes a mixture of hydrofluoric acid and sulfuric acid.

In some embodiments, the nonconformal sacrificial layer includes silicon oxide.

In some embodiments, the nonconformal sacrificial layer and part of the silicon oxide layers and silicon nitride layers abutting the nonconformal sacrificial layer are removed by the first etchant.

In some embodiments, prior to depositing the nonconformal sacrificial layer, a second etchant is applied through the opening to remove post-etch residuals in the opening. The second etchant can include a mixture of sulfuric acid and hydrogen peroxide.

In some embodiments, after depositing the nonconformal sacrificial layer, a variation of a diameter of the opening is not greater than about 25%. In some embodiments, after applying the first etchant, the variation of the diameter of the opening is not greater than about 25%.

According to still another aspect of the present disclosure, a 3D memory device includes a substrate, a memory stack including interleaved conductor layers and dielectric layers on the substrate, and a memory string extending vertically through the memory stack. The memory string includes a channel structure. A variation of a diameter of the channel structure is not greater than about 25%.

In some embodiments, the variation of the diameter is between about 5% and about 25%. In some embodiments, the variation of the diameter is between about 15% and about 25%.

In some embodiments, the memory string further includes a semiconductor plug below the channel structure. The diameter of the channel structure is greater than a diameter of the semiconductor plug, according to some embodiments.

In some embodiments, the channel structure includes a memory film and a semiconductor channel.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming a dielectric stack comprising interleaved first dielectric layers and second dielectric layers on a substrate;
   forming an opening extending vertically through the dielectric stack;

forming a nonconformal sacrificial layer along a sidewall of the opening, such that a variation of a diameter of the opening decreases;

removing the entire nonconformal sacrificial layer and part of the dielectric stack abutting the nonconformal sacrificial layer with a first etchant in a single etching; and forming a channel structure in the opening after removing the nonconformal sacrificial layer and part of the dielectric stack.

2. The method of claim 1, wherein a thickness of the nonconformal sacrificial layer decreases from top to bottom along the sidewall of the opening.

3. The method of claim 1, wherein removing the nonconformal sacrificial layer and part of the dielectric stack comprises applying, through the opening, the first etchant, wherein the first etchant has a selectivity between the first dielectric layer and the second dielectric layer between about 0.9 and about 1.1.

4. The method of claim 1, wherein the selectivity of the first etchant is about 1.

5. The method of claim 1, wherein:
the first and second dielectric layers comprise silicon oxide and silicon nitride, respectively; and
the first etchant comprises a mixture of hydrofluoric acid and sulfuric acid.

6. The method of claim 1, wherein the nonconformal sacrificial layer comprises silicon oxide.

7. The method of claim 1, further comprising, prior to forming the nonconformal sacrificial layer, applying a second etchant, through the opening, to remove post-etch residuals in the opening.

8. The method of claim 7, wherein the second etchant comprises a mixture of sulfuric acid and hydrogen peroxide.

9. The method of claim 1, wherein, after forming the nonconformal sacrificial layer, the variation of the diameter of the opening is not greater than about 25%.

10. The method of claim 9, wherein, after removing the nonconformal sacrificial layer and part of the dielectric stack, the variation of the diameter of the opening is not greater than about 25%.

11. A method for forming a channel hole in a three-dimensional (3D) memory device, comprising:
etching an opening through interleaved silicon oxide layers and silicon nitride layers on a substrate;
depositing a nonconformal sacrificial layer along a sidewall of the opening, a thickness of the nonconformal sacrificial layer decreasing from top to bottom along the sidewall of the opening; and applying, through the opening, a first etchant having a selectivity between silicon oxide and silicon nitride between about 0.9 and about 1.1 to form the channel hole by removing the entire nonconformal sacrificial layer and part of the silicon oxide layers and silicon nitride layers abutting the nonconformal sacrificial layer.

12. The method of claim 11, wherein the selectivity of the first etchant is about 1.

13. The method of claim 11, wherein the first etchant comprises a mixture of hydrofluoric acid and sulfuric acid.

14. The method of claim 11, wherein the nonconformal sacrificial layer comprises silicon oxide.

15. The method of claim 11, further comprising, prior to depositing the nonconformal sacrificial layer, applying a second etchant, through the opening, to remove post-etch residuals in the opening.

16. The method of claim 15, wherein the second etchant comprises a mixture of sulfuric acid and hydrogen peroxide.

17. The method of claim 11, wherein, after depositing the nonconformal sacrificial layer, a variation of a diameter of the opening is not greater than about 25%.

18. The method of claim 17, wherein, after applying the first etchant, the variation of the diameter of the opening is not greater than about 25%.

19. A method for forming a three-dimensional (3D) memory device, comprising:
forming a dielectric stack comprising interleaved first dielectric layers and second dielectric layers on a substrate;
forming an opening extending vertically through the dielectric stack;
forming a nonconformal sacrificial layer along a sidewall of the opening, such that a variation of a diameter of the opening decreases;
removing the entire nonconformal sacrificial layer and part of the dielectric stack abutting the nonconformal sacrificial layer in a single etching step; and
forming a channel structure in the opening after removing the nonconformal sacrificial layer and part of the dielectric stack.

20. The method of claim 1, wherein the first etchant isotropically wet etches the nonconformal sacrificial layer and the part of the dielectric stack at a same etch rate in the single etching.

* * * * *